(12) United States Patent
Feng

(10) Patent No.: US 8,635,039 B1
(45) Date of Patent: Jan. 21, 2014

(54) GRAPHICAL TECHNIQUE FOR RETRIEVING PERMITTIVITY AND PERMEABILITY OF MATERIALS

(75) Inventor: Simin Feng, Ridgecrest, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 280 days.

(21) Appl. No.: 13/032,425

(22) Filed: Feb. 22, 2011

Related U.S. Application Data

(60) Provisional application No. 61/366,488, filed on Jul. 21, 2010.

(51) Int. Cl.
G01N 21/00 (2006.01)
G01R 27/02 (2006.01)
G02B 3/00 (2006.01)

(52) U.S. Cl.
USPC .............................. 702/65; 324/638; 333/239

(58) Field of Classification Search
USPC .......................................................... 702/65
See application file for complete search history.

(56) References Cited

PUBLICATIONS

D. R. Smith, S. Schultz, P. Markos, C.M. Soukoulis "Determination of effective permittivity and permeability of metamaterials from reflection and transmission coefficients" Apr. 19,2002 The American Physical Society, Physical Review B, vol. 65, 195104, p. 1-5.*

N. G. Alexopoulos, C. A. Kyriazidou, H. Contopanagos "Effective Parameters for Metamorphic Materials and Metamaterials Through a Resonant Inverse Scattering Approach" Feb. 2007 IEEE, IEEE Transactions on Microwave Theory and Techniques, vol. 55, No. 2, p. 254-267.*
V. Varadan, R. Ro "Unique Retrieval of Complex Permittivity and Permeability of Dispersive Materials From Reflection and Transmitted Fields by Enforcing Causality" Oct. 2007 IEEE, IEEE Transactions on Microwave Theory and Techniques, vol. 55, No. 10, p. 2224-2230.*
J. Wang, S. Qu, H. Ma, J. Hu, Y. Yang, X. Wu "A Dielectric Resonator-based Route to Left-handed Metamaterials" 2009 Progress In Electromagnetics Research B, vol. 13, p. 133-150.*
Shalaev, Cai, Chettiar, Yuan, Sarychev, Drachev, & Kildishev, Negative index of refraction in optical metamaterials, Optics Letters, Dec. 2005, p. 3356-58, 30, USA.
J.Valentine, J. Li, T. Zentgraf, G.Bartal, & X.Zhang, "An optical cloak made of dielectrics," Nature Materials, Jul. 2009, p. 568-571, 8.
N. Liu, H. Guo, L. Fu, S. Kaiser, H.Schweizer, & H. Geissen, "Three-dimenstional photonic metamaterials at optical frequencies,"Nature Materials, Jan. 2008, 31-37, 7.
Valentine, Zhang, Zentgraf, Ulin-Avila, Genov, Bartal, & Zhang, "Three-dimensional optical metamaterial with a negative refractive index,"Nature, Sep. 2008, 376-380, 455.
L. Epstein, "The Design of Optical Filters," J. Opt. Soc. Am., Nov. 1952, 808-810, Vol. 42, No. 11, USA.
Andryieuski, Malureanu, & Lavrinenko, "Wave propagation retrieval method for metamaterials: Unambigous restoration of effective parameters,"Phys. Rev. B 60, Nov. 2009, 193101.

(Continued)

Primary Examiner — Andrew Schechter
Assistant Examiner — Terence Stifter, Jr.
(74) Attorney, Agent, or Firm — Charlene A. Haley; James M. Saunders

(57) ABSTRACT

A graphical technique and three phase unwrapping techniques for retrieving bulk permittivity and permeability tensors of materials, and more specifically, the new technique provides for retrieving isotropic and anisotropic material parameters.

8 Claims, 6 Drawing Sheets

(56) References Cited

PUBLICATIONS

Koschny, Markos, Economou, Smith, Vier, & Soukoulis, Impact of inherent periodic structure on eff. medium descrip. of left-handed and related metamaterials. Phys Rev B, Jun. 2005, US.

C. Menzel, C. Rockstuhl, T. Paul, & F. Lederer, "Retrieving effective parameters for metamaterials at oblique incidence," May 2008, 195328-1 to 8, Phys Rev B 77, USA.

Smith & Schultz, "Determination of effective permittivity and permeability of metamaterials from reflection and transmission coefficients." Phys Rev B, Apr. 2002, 195104, USA.

Zhang, Fan, Panoiu, Malloy, Osgood, & Brueck, "Experimental Demonstration of Near-Infared Negative-Index Metamaterials," Phys Rev Lett, Sep. 2005, 137404-1 to 4, USA.

Chen, Grzegorczyk, Wu, Pacheco Jr, & Kong, "Robust method to retrieve the constitutive effective parameters of metamaterials," Phys Rev E 70, Jul. 2004, 016608-1 to 7, USA.

\* cited by examiner

US 8,635,039 B1

GRAPHICAL TECHNIQUE FOR RETRIEVING PERMITTIVITY AND PERMEABILITY OF MATERIALS

CROSS-REFERENCE TO RELATED APPLICATIONS

This is a non-provisional patent application claiming benefit of parent provisional application filed in accordance with 35 U.S.C. 111(b), Ser. No. 61/366,488 filed on Jul. 21, 2010, whereby the entire disclosures of which is incorporated hereby reference.

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

The invention generally relates to a graphical technique for retrieving permittivity and permeability of materials, and more specifically, this technique provides for retrieving isotropic and anisotropic material parameters.

Figure 1:
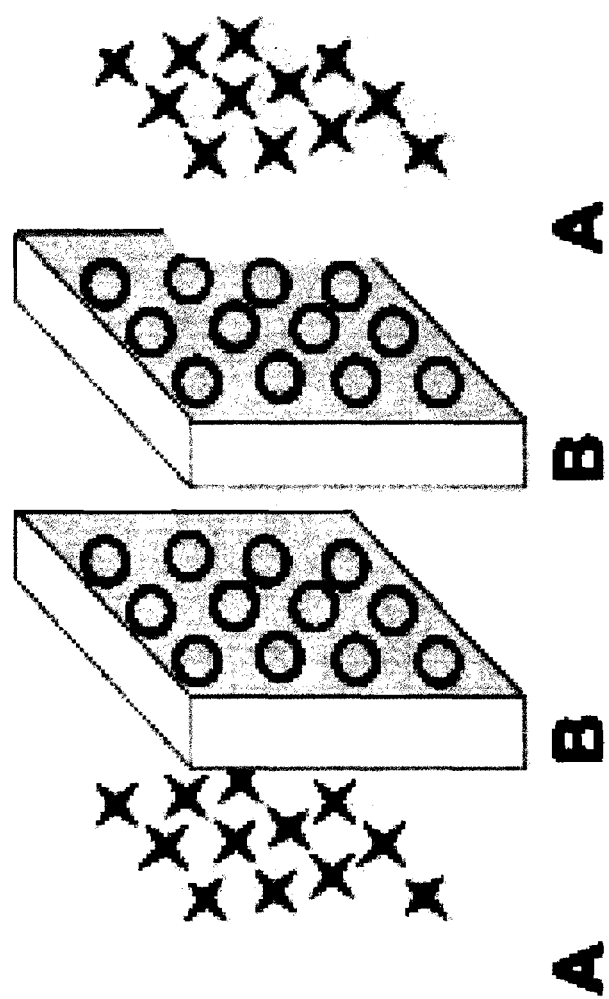
FIG. 1 is a schematic illustrating a construct of a symmetric unit cell, according to embodiments of the invention.

It is to be understood that the foregoing general description and the following detailed description are exemplary and explanatory only and are not to be viewed as being restrictive of the invention, as claimed. Further advantages of this invention will be apparent after a review of the following detailed description of the disclosed embodiments, which are illustrated schematically in the accompanying drawings and in the appended claims.

DETAILED DESCRIPTION OF EMBODIMENTS OF THE INVENTION

The invention generally relates to a graphical technique for retrieving permittivity and permeability of materials, and more specifically, the new technique provides for retrieving isotropic and anisotropic material parameters.

In embodiments of the invention, the equivalent theory is applied to orthorhombic anisotropic materials and provides a general unit-cell construct criterion for achieving a length-independent retrieval of the effective material parameters from a single layer of unit cells. Also introduced is a graphical retrieval method and phase unwrapping techniques. The graphical method utilizes the linear regression technique. This method can reduce the uncertainty of experimental measurements and the ambiguity of phase unwrapping. Moreover, the graphical method can simultaneously determine the bulk values of the six effective material parameters, permittivity and permeability tensors, from a single layer of unit cells without the need of fabricating bulk materials. Fabricating a bulk material of thousands or millions layers requires tremendous resources (time, money, labors, and constituent materials). Currently, there is no effective way to predict bulk material properties. In the current methods, the predicted material properties change with the number of unit-cell layers. That means, the material properties predicted from one unit-cell layer are different from those predicted from two, three, or hundreds unit-cell layers. This invention provides a method to predict bulk material properties from a single unit-cell layer. Predicting bulk material properties from fabricating a single unit-cell layer, instead of thousands and millions unit-cell layers, can save tremendous money and time in material constructs.

Metamaterials (MMs) are artificial materials engineered to achieve unusual electromagnetic (EM) properties that are not normally found in nature. (N. Fang, H. Lee, C. Sun, and X. Zhang, "Sub-diffraction-limited optical imaging with a silver superlens," Science 308, 534-537 (2005); J. Valentine, J. Li, T. Zentgraf, G. Bartal, and X. Zhang, "An optical cloak made of dielectrics," Nat. Mater. 8, 568-571 (2009); S. Feng and K. Halterman, "Parametrically shielding electromagnetic fields by nonlinear metamaterials," Phys. Rev. Lett. 100, 063901 (2008)). A comprehensive review can be found in the book (F. Capolino Ed. *Theory and phenomena of metamaterials* (CRC Press, Taylor and Francis Group, New York, 2009)). Distinguished from photonic crystals, metamaterials are made from periodical structures with unit cells much smaller than the wavelength of light.

A general method to construct large area 3D MMs is layer-by-layer fabrication Technique (J. Valentine, S. Zhang, T. Zentgraf, E. U. Avila, D. A. Genov, G. Bartal, and X. Zhang, "Three-dimensional optical metamaterial with a negative refractive index," Nature (London) 455, 376-380 (2008); N. Liu, H. Guo, L. Fu, S. Kaiser, H. Schweizer, and H. Giessen, "Three-dimensional photonic metamaterials at optical frequencies," Nat. Mater. 7, 31-37 (2008); S. Zhang, W. Fan, N. C. Panoiu, K. J. Malloy, R. M. Osgood, and S. R. J. Brueck, "Experimental demonstration of near-infrared negative-index metamaterials," Phys. Rev. Lett. 95, 137404 (2005); V. M. Shalaev, W. Cai, U. K. Chettiar, H.-K. Yuan, A. K. Sarychev, V. P. Drachev, and A. V. Kildishev, "Negative index of refraction in optical metamaterials," Opt. Lett. 30, 3356-3358 (2005)). In stacked MMs, interaction between adjacent layers makes it difficult to extract bulk material parameters from a single unit-cell layer. It has been found that the retrieved effective metamaterial parameters are often dependent on the number of unit cells along the propagation direction (A. Andryieuski, R. Malureanu, and A. V. Lavrinenko, "Wave propagation retrieval method for metamaterials: Unambiguous restoration of effective parameters," Phys. Rev. B 80, 193101 (2009)).

It appears that there is no clear methodology on how to accurately predict the bulk values of the effective permittivities and permeabilities through a single layer of unit cells. Currently there is no simple and effective way to resolve phase ambiguity in determining the phase of the transmission and reflection of electromagnetic fields because of phase wrapping. Although the phase ambiguity is a common issue for the parameter retrieval of the general composite materials, this issue becomes more significant for metamaterials where typically resonances, positive refractive index, and negative refractive index are all present in the same frequency band. In this application, Herpin's equivalent theorem was applied to orthorhombic anisotropic media and provides a simple way to accurately predict the effective bulk material parameters from a single layer of unit cells. (A. Herpin, "Calcul du pouvoir r'eflecteur d'un systeme stratifi'e quelconque," Compt. Rend. 225, 182-183 (1947)).

All previous methods are based on single data point and do not provide any phase unwrapping technique, and thus they are not accurate. Introduced was a graphical retrieval method and phase unwrapping techniques, which can simultaneously determine the six material parameters, the permittivity and permeability tensors from one unit cell.

Equivalent Theory

Layer-by-layer fabrication method renders metamaterials intrinsically anisotropic. In MMs one unit-cell layer is usually composed of several sub-layers of different materials or nanostructures. We limit our discussion in nonchiral materials. To illustrate the key point we adopt multilayer method that has been used to model MMs by many groups (D. R. Smith, S. Schultz, P. Markos, and C. M. Soukoulis, "Determination of effective permittivity and permeability of metamaterials from reflection and transmission coefficients," Phys. Rev. B 65, 195104 (2002); 12. T. Koschny, P. Marko's, E. N. Economou, D. R. Smith, D. C. Vier, and C. M. Soukoulis, "Impact of inherent periodic structure on effective medium description of left-handed and related metamaterials," Phys. Rev. B 71, 245105 (2005); 13. C. Menzel, C. Rockstuhl, T. Paul, and F. Lederer, "Retrieving effective parameters for metamaterials at oblique incidence," Phys. Rev. B 77, 195328 (2008); 14. X. Chen, T. M. Grzegorczyk, B.-I. Wu, J. Pacheco, Jr., and J. A. Kong, "Robust method to retrieve the constitutive effective parameters of metamaterials," Phys. Rev. E 70, 016608 (2004)). We further assume that the principal axes of the sub-layers are parallel in each direction. In the principal coordinate system, the permittivity and permeability tensors are given by $$\bar{\varepsilon}_n = \begin{pmatrix} \varepsilon_{nx} & 0 & 0 \\ 0 & \varepsilon_{nv} & 0 \\ 0 & 0 & \varepsilon_{nz} \end{pmatrix}, \bar{\mu}_n = \begin{pmatrix} \mu_{nx} & 0 & 0 \\ 0 & \mu_{nv} & 0 \\ 0 & 0 & \mu_{nz} \end{pmatrix}, \quad \text{Eq. 1}$$

where n=1,2, . . . . The scalar terms $\varepsilon_{nj}$ and $\mu_{nj}$ (j=x,y,z) are complex. Consider a monochromatic wave of frequency ω with time dependence exp(−iωt) propagates inside the orthorhombic anisotropic materials. In each layer we have $$\nabla \times (\bar{\mu}_n^{-1} \cdot \nabla \times E) = k_0^2 (\bar{\varepsilon}_n \cdot E),$$

$$\nabla \times (\bar{\varepsilon}_n^{-1} \cdot \nabla \times H) = k_0^2 (\bar{\mu}_n \cdot H), \quad \text{Eq. 2}$$

where $k_0 = \omega/c$. When the plane of incidence is one of the crystal planes, the TE and TM polarizations are decoupled.

FIG. 1. A schematic shows how to construct a symmetric unit cell, which is composed of two original asymmetric unit cells.

According to Herpin's equivalent theorem, every general multilayer is equivalent to a two-homogeneous-layer system and every symmetric multilayer is equivalent to a single homogeneous layer, characterized by an equivalent index and equivalent thickness. (L. I. Epstein, "The design of optical filters," J. Opt. Soc. Am. 42, 806-810 (1952)). In metamaterials, a single unit-cell layer can be considered as a multilayer system. So it is equivalent to a two-homogeneous-layer system, denoted as AB. We can then construct a symmetric unit cell by cascading two unit cells as ABBA, which is equivalent to a single homogeneous layer according to Herpin's theorem. This process is illustrated in FIG. 1. Applying this methodology, a symmetric unit-cell layer can often be constructed regardless the number of sub-layers and complexity of each sub-layer in the original unit cell. The permittivities and permeabilities retrieved from the symmetric unit cell, which is composed of two original asymmetric unit cells, will represent the bulk material parameters. Thus, a length-independent description can be achieved.

To make it more clearly, let M represents the characteristic matrix of one symmetric unit cell. According to Herpin's equivalent theorem, it can be replaced by an equivalent single layer. Assume the x-z plane is the plane of incidence. For TM mode, i.e. H=(0,H$_y$,0) and E=(E$_x$,0,E$_z$), we have $$M_{11} = M_{22} = \cos\Psi_e, \quad \text{Eq. 3}$$

$$M_{12} = \frac{\sin\Psi_e}{i\mathcal{Z}_e}, M_{21} = -i\mathcal{Z}_e \sin\Psi_e,$$

where $\Psi_e$ is the equivalent phase thickness of the symmetric unit cell; $\mathcal{Z}_e$ is the equivalent impedance. When the material contains N-layer symmetric unit cells, the characteristic matrix of the material is given by $$\begin{pmatrix} \cos\Psi_e & \frac{1}{i\mathcal{Z}_e}\sin\Psi_e \\ -i\mathcal{Z}_e \sin\Psi_e & \cos\Psi_e \end{pmatrix}^N = \begin{pmatrix} \cos(N\Psi_e) & \frac{1}{i\mathcal{Z}_e}\sin(N\Psi_e) \\ -i\mathcal{Z}_e \sin(N\Psi_e) & \cos(N\Psi_e) \end{pmatrix}. \quad \text{Eq. 4}$$

A similar expression for TE mode can be obtained by replacing the $\mathcal{Z}_e$ with the negative admittance $-\mathcal{Y}_e$. Here the $\mathcal{Z}_e$ and $\mathcal{Y}_e$ are, respectively, the generalized impedance and admittance because they include incidence angle, i.e., Eq. (4) is valid for both normal and oblique incidence. They are given by $$\text{TM: } \mathcal{Z}_e = \frac{k_z}{k_0 \varepsilon_x}, \quad k_z^2 = k_0^2 \varepsilon_x \mu_y - \frac{\varepsilon_x}{\varepsilon_z} k_x^2, \quad \text{Eq. 5}$$

$$\text{TE: } \mathcal{Y}_e = \frac{k_z}{k_0 \mu_x}, \quad k_z^2 = k_0^2 \varepsilon_y \mu_x - \frac{\mu_x}{\mu_z} k_x^2,$$

where ($\varepsilon_x,\varepsilon_y,\varepsilon_z$) and ($\mu_x,\mu_y,\mu_z$) are, respectively, the effective permittivities and permeabilities of the equivalent layer. As shown in Eq. (4), the total phase of a N-layer system equals N times the phase $\Psi_e$ of the single layer; whereas the impedance $\mathcal{Z}_e$ or admittance $\mathcal{Y}_e$ is independent of the number of layers. These properties imply that the material parameters retrieved from the N layers of unit cells are the same as those retrieved from one layer of unit cells. In other words, the bulk metamaterial parameters can be predicted from a single symmetric unit cell. Note that the characteristic matrix of an N-layer asymmetric unit cells does not have the nice properties as those in Eq. (4). As a consequence, the retrieved material parameters will be dependent on the number of unit cells along the propagation direction. Hence, the bulk material parameters cannot be predicted from one unit-cell layer. In other words, a length-independent description cannot be achieved for asymmetric unit cells.

Graphical retrieval method In this section, we will introduce a graphical retrieval method based on Herpin's theorem and the previous method. (D. R. Smith, S. Schultz, P. Marko's, and C. M. Soukoulis, "Determination of effective permittivity and permeability of metamaterials from reflection and transmission coefficients," Phys. Rev. B 65, 195104 (2002)). From above discussion a symmetric unit cell can be represented by three equivalent layers ABA. Let the z-direction perpendicular to the plane of the layers. Assume each layer is orthorhombic anisotropic with the principal axes parallel in each direction and the effective permittivity and permeability tensors are given by Eq. (1). Let the x-z plane be the plane of incidence. The characteristic matrix of TM mode is defined as $$\begin{pmatrix} H_y^i \\ E_x^i \end{pmatrix} = M \begin{pmatrix} H_y^o \\ E_x^o \end{pmatrix} = \begin{pmatrix} M_{11} & M_{12} \\ M_{21} & M_{22} \end{pmatrix} \begin{pmatrix} H_y^o \\ E_x^o \end{pmatrix}. \quad \text{Eq 6}$$

where 'i' refers to the input; and 'o' refers to the output. By matching boundary condition, the relationship between the scattering and characteristic matrices of a unit cell is given by $$M_{11} = M_{22} = \frac{[(1+S_{21})(1-S_{12})+S_{11}S_{22}]}{2S_{11}}, \quad \text{Eq 7}$$

$$M_{12} = \frac{[(1+S_{21})(1+S_{12})-S_{11}S_{22}]}{2S_{11}\mathscr{Z}_o},$$

$$M_{21} = \frac{\mathscr{Z}_i}{2S_{11}}[(1-S_{21})(1-S_{12})-S_{11}S_{22}].$$

Where $Z_i$ and $Z_o$ are, respectively, the generalized input and output impedance whose values depend on the incidence angle and background permittivity and permeability at the input and output sides. In our definition, $S_{ij}$ (i=j) is related to the transmission and $S_{ij}$ (i≠j) is related to the reflection. That means, for the TE polarization $S_{11}$ and $S_{21}$ are, respectively, the transmission and reflection coefficients of the electric field; whereas for the TM polarization the transmission and reflection coefficients of the electric field are given by $$\frac{\varepsilon_1 k_{2z}}{\varepsilon_2 k_{1z}} S_{11}$$

and $-S_{21}$, respectively. Note that as long as the layer has inversion symmetry, M11=M22 regardless the input and output impedances. For scattering matrix, $S_{11}=S_{22}$ only when $Z_i=Z_o$. In addition when $M_{11}=M_{22}$, we then also have $S_{12}=S_{21}$. From Eq. (3), the dispersion relation and the effective impedance $Z_e$ of the unit cell ABA are given by $$\cos(K_e d) = M_{11} = \cos(k_{1z}d_1)\cos(k_{2z}d_2) - \eta^1 \sin(k_{1z}d_1)\sin(k_{2z}d_2). \quad \text{Eq 8}$$

-continued $$\mathscr{Z}_e^2 = \frac{M_{21}}{M_{12}} = \mathscr{Z}_1^2 \frac{\sin(k_{1z}d_1)\cos(k_{2z}d_2) + \eta^1 \cos(k_{1z}d_1)\sin(k_{2z}d_2) - \eta^- \sin(k_{2z}d_2)}{\sin(k_{1z}d_1)\cos(k_{2z}d_2) + \eta^1 \cos(k_{1z}d_1)\sin(k_{2z}d_2) + \eta^- \sin(k_{2z}d_2)}.$$

where the phase $\Psi_e = K_e d$, and the $K_e$ is the effective propagation constant. The subscript 1 and 2 refer to the layer A and B, respectively. The $\mathscr{Z}_1$ is the generalized impedance of the equivalent layer A. The z-component wave vector $k_{1z}$ and $k_{2z}$ are determined from the dispersion relations in Eq. (5). The $d_1$ is twice the thickness of layer A; and the $d_2$ is the thickness of layer B. The period of the symmetric unit cell is $d=d_1+d_2$. Other parameters in Eq. (8) are given by $$\eta^\pm = \frac{1}{2}\left(\frac{\varepsilon_{2x}k_{1z}}{\varepsilon_{1x}k_{2z}} \pm \frac{\varepsilon_{1x}k_{2z}}{\varepsilon_{2x}k_{1z}}\right) \text{ for TM}, \quad \text{Eq 9}$$

$$\eta^\pm = \frac{1}{2}\left(\frac{\mu_{2x}k_{1z}}{\mu_{1x}k_{2z}} \pm \frac{\mu_{1x}k_{2z}}{\mu_{2x}k_{1z}}\right) \text{ for TE}.$$

Although some MMs are mesoscopic media, nevertheless we restrict our consideration to those satisfying d<<λ, after tedious derivation, Eq. (8) can be simplified to $$TM: \frac{K_e^2}{k_0^2} = \bar{\varepsilon}_x \bar{\mu}_y - \frac{\bar{\varepsilon}_x}{\bar{\varepsilon}_z}\frac{k_x^2}{k_0^2}, \quad \mathscr{U}_e^2 = \frac{\bar{\mu}_y}{\bar{\varepsilon}_x} - \frac{k_x^2}{k_0^2 \bar{\varepsilon}_x \bar{\varepsilon}_z}, \quad \text{Eq 10}$$

$$TE: \frac{K_e^2}{k_0^2} = \bar{\varepsilon}_y \bar{\mu}_x - \frac{\bar{\mu}_x}{\bar{\mu}_z}\frac{k_x^2}{k_0^2}, \quad \mathscr{U}_e^2 = \frac{\bar{\varepsilon}_y}{\bar{\mu}_x} - \frac{k_x^2}{k_0^2 \bar{\mu}_x \bar{\mu}_z},$$

Figure 2:
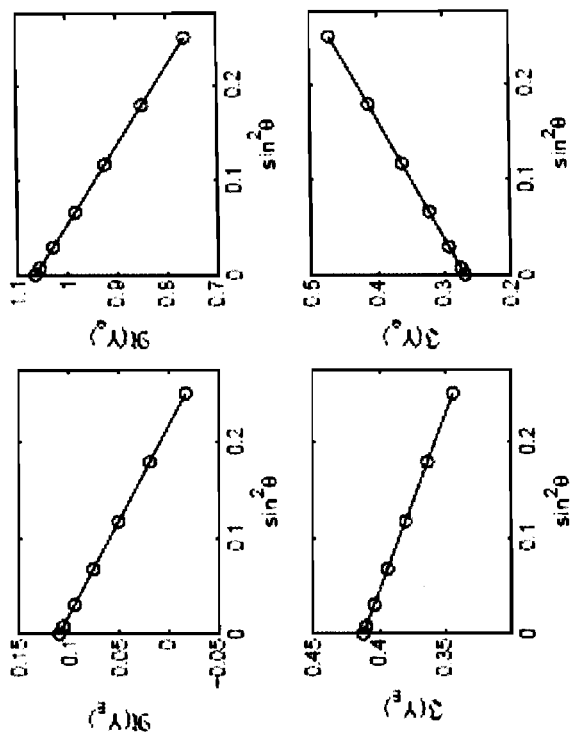
FIG. 2 are graphs illustrating retrieval lines at the frequency 30 THz calculated from the scattering matrix of a single layer of unit cells at seven incidence angles (denoted as circles) uniformly distributed from 0 to 30 degree; (a) TM polarization: dispersion lines (left panels) and impedance lines (right panels); (b) TE polarization: dispersion lines (left panels) and admittance lines (right panels), according to embodiments of the invention.
Figure 2:
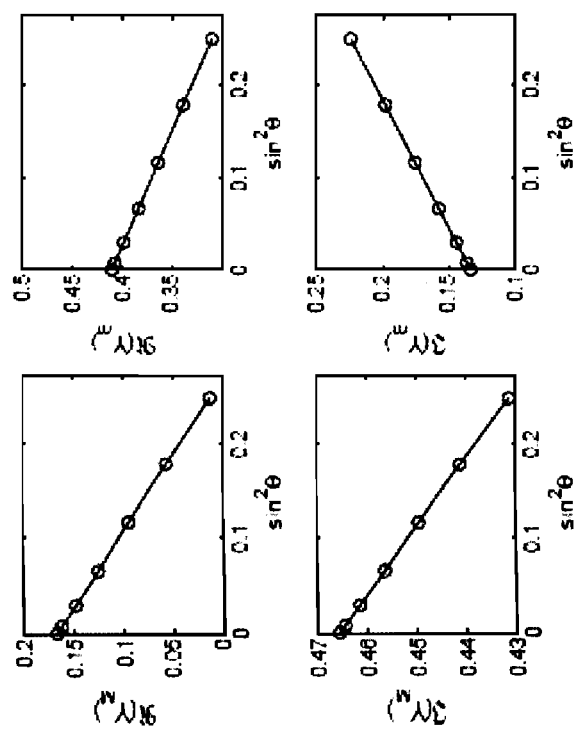

Here, the $\bar{\varepsilon}_j$ and $\bar{\mu}_j$ (j=x,y,z) are the bulk values of the effective permittivities and permeabilities, respectively. They are related to the material parameters of the equivalent layers A and B through $$\bar{\varepsilon}_p = \frac{d_1 \varepsilon_{1p} + d_2 \varepsilon_{2p}}{d}, \quad \bar{\varepsilon}_z = \frac{d\varepsilon_{1z}\varepsilon_{2z}}{d_1 \varepsilon_{2z} + d_2 \varepsilon_{1z}}, \quad \text{Eq 11}$$

$$\bar{\mu}_p = \frac{d_1 \mu_{1p} + d_2 \mu_{2p}}{d}, \quad \bar{\mu}_z = \frac{d\mu_{1z}\mu_{2z}}{d_1 \mu_{2z} + d_2 \mu_{1z}},$$

where p=x,y. Equation (11) is a simplification of the most general linear case treated by Lakhtakia[16]. In practice, the material parameters of the equivalent layers are unknown. One can only measure scattering parameters. In most experiments $\mathscr{Z}_i = \mathscr{Z}_o$, combining Eqs. (7) and (10), we obtained the retrieval formula:

$$TM: Y_M = \bar{\varepsilon}_x \bar{\mu}_y - \frac{\bar{\varepsilon}_x}{\bar{\varepsilon}_z}X, \quad Y_m = \frac{\bar{\mu}_y}{\bar{\varepsilon}_x} - \frac{X}{\bar{\varepsilon}_x \bar{\varepsilon}_z}, \quad \text{Eq 12}$$

$$TE: Y_E = \bar{\varepsilon}_y \bar{\mu}_x - \frac{\bar{\mu}_x}{\bar{\mu}_z}X, \quad Y_e = \frac{\bar{\varepsilon}_y}{\bar{\mu}_x} - \frac{X}{\bar{\mu}_x \bar{\mu}_z},$$

Where $$X \equiv \varepsilon_b \mu_b \sin^2\theta, \quad \text{Eq 13 and 14}$$

$$Y_m \equiv \frac{\mu_b}{\varepsilon_b} S\cos^2\theta,$$

$$Y_e \equiv \frac{\varepsilon_b}{\mu_b} S\cos^2\theta,$$

$$S \equiv \frac{(1-S_{21})^2 - S_{11}^2}{(1+S_{21})^2 - S_{11}^2},$$

$$Y_M \equiv Y_E \equiv \left\{ \frac{1}{k_0 d}\left[2m\pi \pm \cos^{-1}\left(\frac{1-S_{21}^2+S_{11}^2}{2S_{11}}\right)\right]\right\}^2,$$

$$m = 0, \pm 1, \pm 2, \ldots,$$

where q is the incidence angle. The $\epsilon_b$ and $\epsilon_b$ are, respectively, the background relative permittivity and permeability. The retrieval formulas in Eq. (12) provide four straight lines ($Y_M, Y_m, Y_E, Y_e$ vs. X), two for each polarization. The $Y_M$ and $Y_E$ represent the dispersion lines for TM and TE polarizations, respectively. The $Y_m$ and $Y_e$ are the corresponding impedance and admittance lines. These straight lines are easy to implement experimentally. In embodiments, the retrieval formulas provide eight straight lines due to real and imaginary parts of equation 12 and is plotted separately. These eight straight lines are illustrated in FIG. 2.

After measuring the scattering parameters at several incidence angles and plotting the data according to Eqs. (12)-(14), use linear regression technique to calculate the slopes and Y-intercepts of the four lines. From the slopes and Y-intercepts, the six effective material parameters, $\epsilon_j$ and $\mu_j$ (j=x, y,z) can be retrieved simultaneously. Let $Y_M^0$ and $Y_m^0$ represent the Y-intercepts of the two lines in TM polarization, $S_M$ and $S_m$ the corresponding slopes of the lines; whereas $Y_E^0$, $Y_e^0$, $S_E$, and $S_e$ are the corresponding quantities for TE polarization. Thus, $$TM: n_m = \pm\sqrt{Y_M^0}, \quad Z = \pm\sqrt{Y_m^0}, \quad \bar{\epsilon}_x = \frac{n_m}{Z}, \quad \text{Eq 15}$$

$$\bar{\mu}_y = n_m Z, \quad \bar{\epsilon}_z = -\frac{\bar{\epsilon}_x}{S_M},$$

$$TE: n_e = \pm\sqrt{Y_E^0}, \quad Y = \pm\sqrt{Y_e^0}, \quad \bar{\epsilon}_y = n_e Y,$$

$$\bar{\mu}_x = \frac{n_e}{Y}, \quad \bar{\mu}_z = \frac{\bar{\mu}_x}{S_E},$$

where the ± sign in Eq. (15) can be fixed by requiring the imaginary part of refractive index greater than zero, i.e. $\Im(n_m)>0$, $\Im(n_e)>0$ and the real part of impedance and admittance greater than zero, i.e. $\Re(Z)>0$, and $\Re(Y)>0$ for passive media. (D. R. Smith, S. Schultz, P. Marko's, and C. M. Soukoulis, "Determination of effective permittivity and permeability of metamaterials from reflection and transmission coefficients," Phys. Rev. B 65, 195104 (2002)).

Resolving Phase Branch

There are two issues regarding the branch determination in Eq. (14), the ± sign in front of the inverse cosine and the phase branch m. The inverse cosine $\cos^{-1}(\bullet)$ represents the principal value: $0 \le \cos^{-1}(\bullet) \le \pi$. Knowing only the cosine value, the phase angle cannot be determined. One need the information of sine, which can be obtained from the imaginary part of the cosine as following:

$$A \equiv \frac{1-S_{21}^2+S_{11}^2}{2S_{11}} = \quad \text{Eq 16}$$

$$\cos\varphi = \cos(\varphi_r + i\varphi_i) = \cos\varphi_r \cosh\varphi_i - i\sin\varphi_r \sinh\varphi_i.$$

where $\phi_r$ and $\phi_i$ are real. For passive medium, $\phi_i > 0$, and thus $\sinh\phi_i > 0$. Therefore, the ± sign in front of the inverse cosine in Eq. (14) can be resolved from the imaginary part of A:

$$\varphi = \begin{cases} \cos^{-1} A & \text{if } \Im(A) < 0 \\ 2\pi - \cos^{-1} A & \text{if } \Im(A) > 0. \end{cases} \quad \text{Eq 17}$$

After determining the ± sign, next step is to resolve the correct phase branch m. This part can be very confusing when negative refractive index might be involved. Notice that among the four retrieval lines in Eq. (12), only the dispersion lines, $Y_M$~X and $Y_E$~X, are functions of the phase branch m, the impedance and admittance lines are independent of m. Employing this property, we provide three methods that might help to resolve the correct phase branch m.

Method-1, Using $\bar{\epsilon}_x^2$ and $\bar{\mu}_x^2$: For the TM polarization in Eq. (12), the $\bar{\epsilon}_x^2$ can be obtained either from the intercepts as $$\bar{\epsilon}_x^2 = \frac{Y_M^0}{Y_m^0}$$

or from the slopes as $$\bar{\epsilon}_x^2 = \frac{S_M}{S_m},$$

and the two results should be close. When the branch is wrong, the two results can be significantly different. Similarly for the TE polarization, the $\bar{\mu}_x^2$ can be obtained from either $$\bar{\mu}_x^2 = \frac{Y_E^0}{Y_e^0}$$

or $$\bar{\mu}_x^2 = \frac{S_E}{S_e}.$$

Hence, the correct branch m is the one that minimizes the absolute value of the differences, i.e.

$$TM: \min\left\{\left|\frac{Y_M^0(m)}{Y_m^0} - \frac{S_M(m)}{S_m}\right| : m = 0, \pm 1, \pm 2, \ldots\right\}. \quad \text{Eq 18}$$

$$TE: \min\left\{\left|\frac{Y_E^0(m)}{Y_e^0} - \frac{S_E(m)}{S_e}\right| : m = 0, \pm 1, \pm 2, \ldots\right\}.$$

Method-2, Using $$\frac{\bar{\mu}_y}{\bar{\epsilon}_z} \text{ and } \frac{\bar{\epsilon}_y}{\bar{\mu}_z}:$$

Alternatively, we can use $$\frac{\bar{\mu}_y}{\bar{\epsilon}_z}$$

for TM and $$\frac{\bar{\epsilon}_y}{\bar{\mu}_z}$$

for TE as criteria to determine the correct phase branch, i.e.

$$TM:\min\{|Y_M^0(m)S_m - Y_m^0 S_M(m)|:m=,\pm 1,\pm 2,\ldots\},$$

$$TE:\min\{|Y_E^0(m)S_e - Y_e^0 S_E(m)|:m=,\pm 1,\pm 2,\ldots\}. \qquad \text{Eq 19}$$

Method-3, Using $\bar{\epsilon}_x\bar{\mu}_y$ and $\bar{\epsilon}_y\bar{\mu}_z$: The third method is to use $\bar{\epsilon}_z\bar{\mu}_y$ for TM and $\bar{\epsilon}_y\bar{\mu}_z$ for TE as criteria to select the correct phase branch. Then, the algorithm becomes $$TM: \quad \min\left\{\left|\frac{Y_M^0(m)}{S_M(m)} - \frac{Y_m^0}{S_m}\right| : m=0,\pm 1, \pm 2, \ldots\right\}. \qquad \text{(Eq 20)}$$

$$TE: \quad \min\left\{\left|\frac{Y_E^0(m)}{S_E(m)} - \frac{Y_e^0}{S_e}\right| : m=0,\pm 1, \pm 2, \ldots\right\}.$$

In above three methods, the branch number m predicted by the first two methods is always consistent for all the frequencies in the several examples we tested. The third method predicts the same result as the first two for most of the frequencies, but sometimes it can be different by ±1 at the edge of phase transition frequencies in resonant regimes. Note that before applying Eqs. (18), (19), or (20) to resolve the correct phase branch, the ± sign in front of the inverse cosine in Eq. (14) must be determined first. From the several examples we tested, using above branch-resolving techniques, there is no need to recourse adjacent frequencies in determining the correct phase branch. Recoursing adjacent frequencies can become confusing when both positive and negative refractive indices are present in the same frequency band.

Discussion

In this section, we provide an example to show how to implement the graphical method from the scattering parameters. Typically the background is lossless and thus, the X variable in Eq. (12) is real; whereas the slops and Y-intercepts are usually complex. The real and imaginary parts of the retrieval lines should be plotted separately as shown in FIG. 2 which was calculated from the scattering matrix. Drude model is used for the effective material parameters of the equivalent layers A and B, $$\varepsilon = 1 - \frac{f_{ep}^2}{f^2 - f_{er}^2 + i\gamma f}, \qquad \text{Eq 21}$$

-continued $$\mu = 1 - \frac{f_{mp}^2}{f^2 - f_{mr}^2 + i\gamma f},$$

where $f_{ep}$=30 THz, $f_{mp}$=20 THz, and $\gamma$=3 THz. The $\epsilon_x$ and $\mu_x$ are described by above equations with resonances at $f_{er}$=20 THz and $f_{mr}$=25 THz for the layer A and at $f_{er}$=35 THz and $f_{mr}$=37 THz for the layer B.

FIG. 2. Retrieval lines at the frequency 30 THz (however any frequency will work) calculated from the scattering matrix of a single layer of unit cells at seven incidence angles (denoted as circles) uniformly distributed from 0 to 30 degree. The horizontal axis is $\sin^2\theta$. Background medium is in a vacuum. Top panels: real part. Bottom panels: imaginary part. (a) TM polarization: dispersion lines (left panels) and impedance lines (right panels). (b) TE polarization: dispersion lines (left panels) and admittance lines (right panels).

Figure 3:
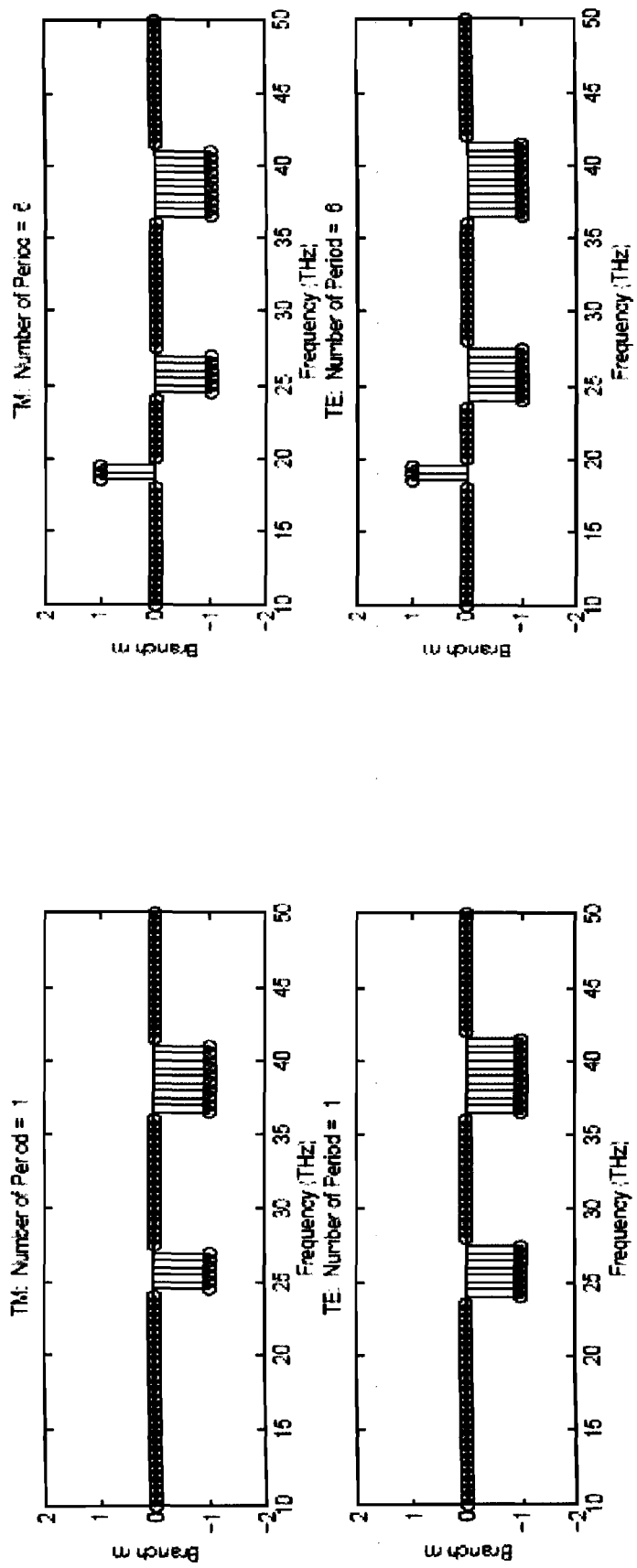
FIG. 3 show graphs illustrating branch number predicted by the method-3 [Eq. (20)] vs. frequency, according to embodiments of the invention.

The other parameters for A: $\epsilon_y=\epsilon_x-0.3$, $\epsilon_z=\epsilon_x+2$, $\mu_y=\mu_x-0.5$, and $\mu_z=1$. The other parameters for B: $\epsilon_y=\epsilon_x-0.8$, $\epsilon_z=\epsilon_x-0.5$, $\mu_y=\mu_x+0.2$, and $\mu_z=\mu_x-0.6$. The thickness is 240 nm for the layer A and 320 nm for the layer B. Thus, the period of the unit cell (ABA) is 800 nm. FIG. 3 shows the correct phase branch m predicted for each frequency in the regime of interest for the thickness of one (a) and six (b) periods. In our example since d<<1, for one unit-cell thickness, most of the frequencies are within the fundamental branch m=0 except for the regime of negative index of refraction [see FIG. 4] where m=−1. For the six-period thickness, the phase branch jumps to m=1 in the frequency range 18~20 THz due to the high valves of the positive refractive index in this regime [see FIG. 4(a)].

Figure 4:
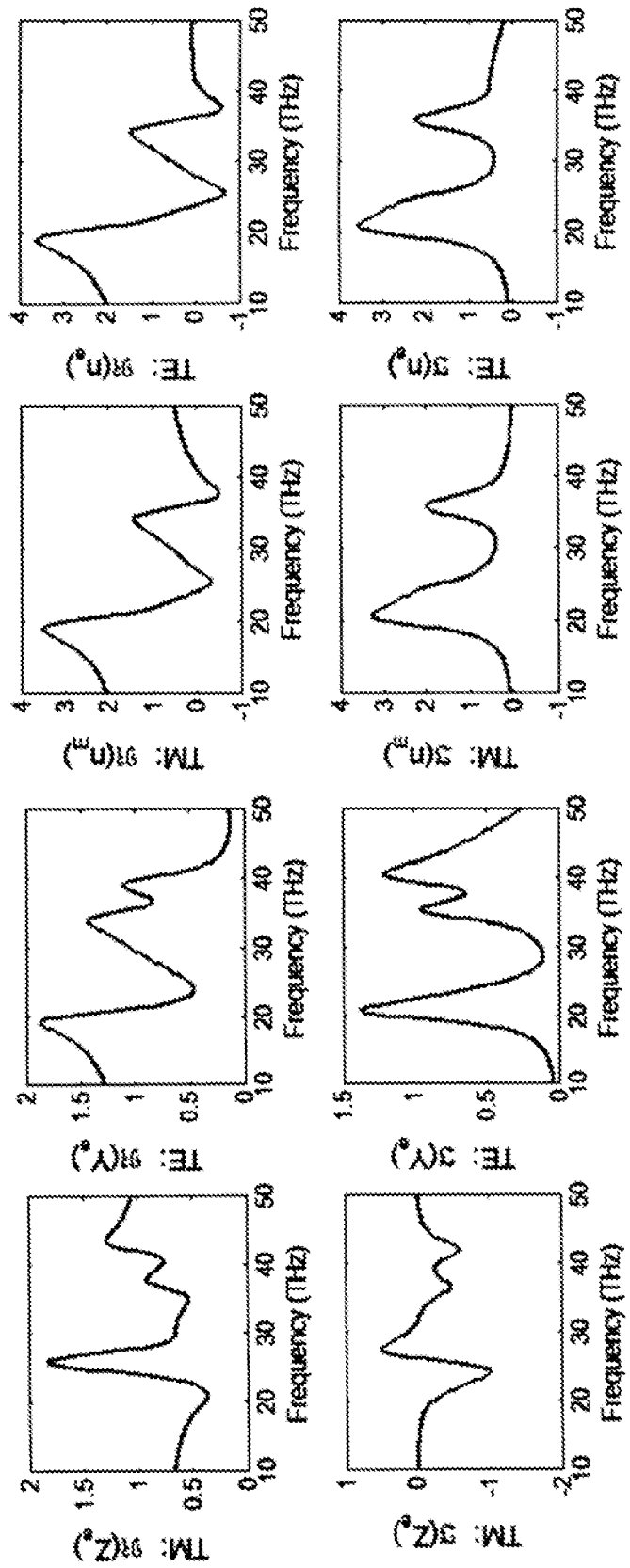
FIG. 4 show graphs illustrating effective refractive index, impedance, and admittance retrieved from a single unit cell layer. Top panels: real part. Bottom panels: imaginary part, according to embodiments of the invention.

Shown in FIG. 4 are the effective index of refraction, impedance, and admittance retrieved from one unit cell. These values are the same as those retrieved from the six unit cells. In this example, both TM and TE polarizations contain two frequency bands where the effective index of refraction is negative. As illustrated in FIG. 3, these two negative bands are accurately captured by the branch-resolving techniques.

Figure 5:
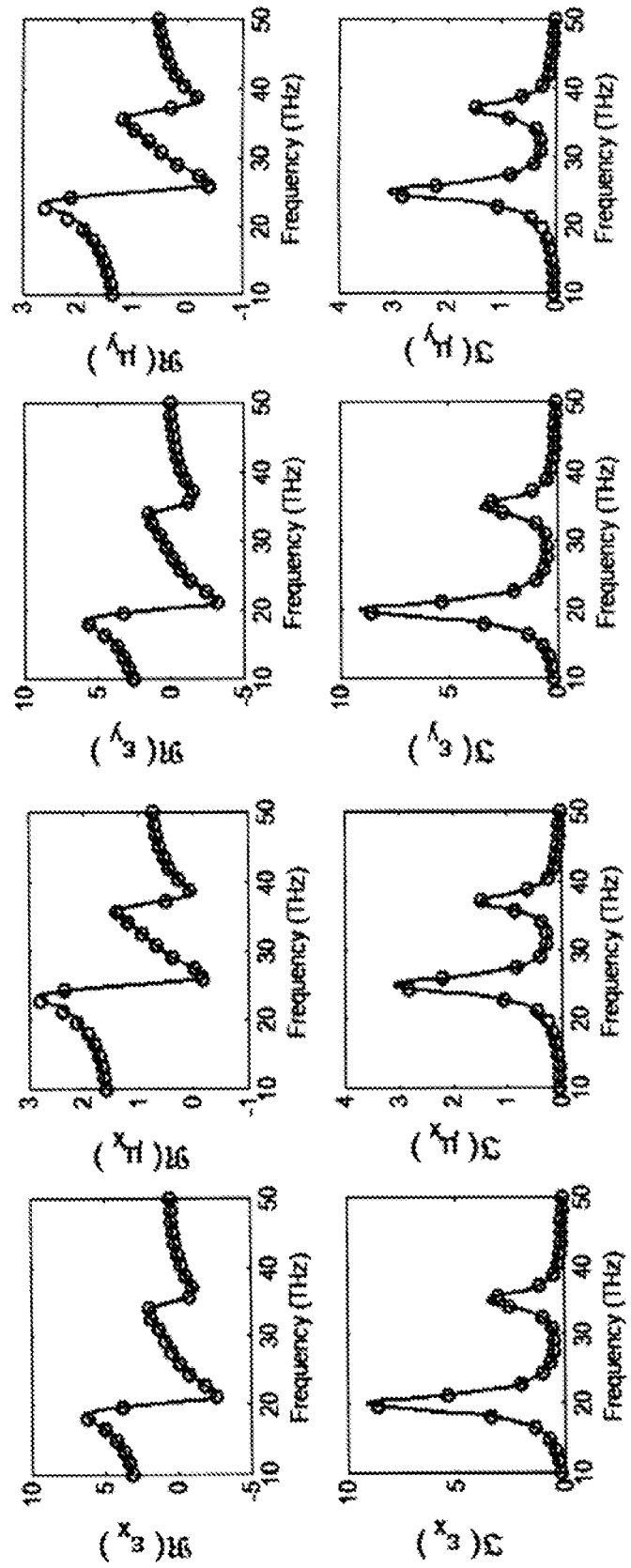
FIG. 5 show graphs illustrating in-plane values of the retrieved material parameters. Upper panels: real parts. Lower panels: imaginary parts, according to embodiments of the invention.
Figure 6:
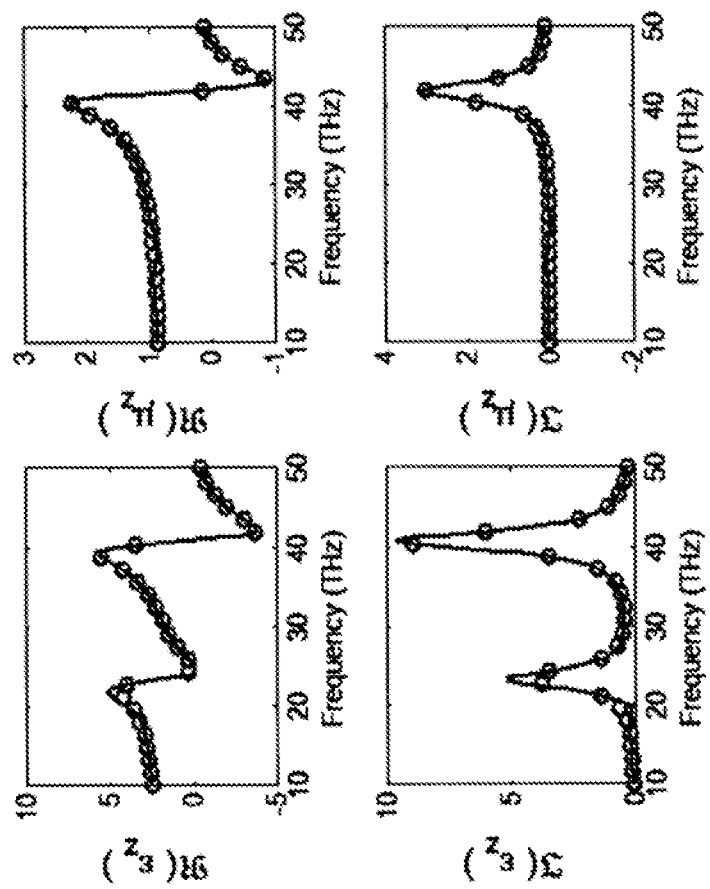
FIG. 6 show graphs illustrating the effective $\epsilon_z$ (right panels) and $\mu_z$ (left panels), according to embodiments of the invention.

The six retrieved effective permittivities and permeabilities are shown in FIGS. 5 and 6 in the blue-solid curves, which are obtained from the graphical-retrieval and phase-unwrapping scheme, i.e. Eqs. (15), (17), and (20). For comparison, we also show the effective permittivities and permeabilities calculated from Eq. (11) in FIGS. 5 and 6 in the green-circle curves. The retrieved effective material parameters agree very well with the results calculated from the effective medium theory. These values represent the bulk values of the material parameters since they are extracted from the symmetric unit cells. We have successfully applied the graphical method and phase-unwrapping techniques to our recent experiment (M. J. Roberts, S. Feng, M. Moran, and L. Johnson, "Effective permittivity near zero in nanolaminates of silver and amorphous polycarbonate," J. Nanophoton. 4, 043511 (2010)). From the experimental point of view, the straight-line graphical method is more accurate than the methods using single data point. The linear regression technique is based on collective data points measured at several incidence angles. It has an averaging effect and thus reduces the uncertainty of measurements. Using several incidence angles can also help to resolve the phase ambiguity. After determining the effective parameters of the bulk material, Eq. (11) can be used to recovery the effective parameters of the equivalent layers if we are interested in. This extra benefit may help to improve the unit-cell design.

When the tensors in Eq. (1) rotate about the z-axis without rotating the coordinate system, the off-diagonal elements in the x-y plane will not be zero ($\epsilon_{xy}\neq 0$ and $\mu_{xy}\neq 0$), and thus the x and y components of the electromagnetic fields will be coupled. The dispersion relations in Eq. (5) will no longer be valid. Without the proper modification, the current parameter retrieval scheme cannot be applied to this scenario.

FIG. 3. Branch number predicted by the method-3 [Eq. (20)] vs. frequency. (left) One-period thickness; (right) Six-period thickness. Since d<<λ, most of the frequencies are in the fundamental branch m=0. The m=−1 indicates the frequencies of the negative refractive index [n<0, see FIG. 4]. The m=1 corresponds to the frequencies of the high valves of the positive refractive index [see FIG. 4]. Top: TM polarization. Bottom: TE polarization.

FIG. 4. Effective refractive index, impedance, and admittance retrieved from a single unit cell layer. Top panels: real part. Bottom panels: imaginary part. Right panels: Retrieved refractive index for TM polarization (left panels) and for TE polarization. Left panels: Retrieved impedance for TM polarization. Right panels: Retrieved admittance for TE polarization.

The final results, i.e. retrieved bulk material parameters, permittivity and permeability tensors, are shown in FIGS. 5 and 6. Note there are a total of six complex parameters in FIGS. 5 and 6. FIG. 5. In-plane values of the retrieved material parameters. Upper panels: real parts. Lower panels: imaginary parts. Left panels: The effective $\epsilon_x$ (left panels) and $\mu_x$ (right panels). Right panels: The effective $\epsilon_y$ (left panels) and $\mu_y$ (right panels).

FIG. 6. The effective $\epsilon_z$ (right panels) and $\mu_z$ (left panels). Upper panels: real parts. Lower panels: imaginary parts.

Conclusions

In conclusions, we have shown that symmetric unit cells can often be constructed in metamaterials regardless the number of sub-layers and the complexity of each sub-layers in the original unit cells. The graphical retrieval method and phase unwrapping techniques presented here might be a useful tool for metamaterial constructs.

The invention may be used for measuring electromagnetic properties of materials, including metamaterials, radomes, and window materials. Graphical retrieval method and phase unwrapping techniques are easy to implement into any commercial software and instruments that are used to measure the permittivity and permeability of isotropic and anisotropic materials.

Current retrieval method is used for isotropic materials and is based on a single data point. The current method is not accurate and cannot resolve phase ambiguity. A patent database search was performed to find prior mention of the invention but none was found.

Currently, there is no effective way to resolve phase ambiguity in determining the phase of the transmission and reflection of electromagnetic fields because of phase wrapping. The phase ambiguity is a common issue for parameter retrieval of the general composite materials. This issue becomes more significant for metamaterials where typically resonances, positive refractive index, and negative refractive index are all present in the same frequency band.

Embodiments of the invention describe a graphical retrieval method and three phase unwrapping techniques. The graphical retrieval method utilizes collective data points measured at several incidence angles. The graphical retrieval technique can reduce the uncertainty of measurement and ambiguity of phase unwrapping. Moreover, this method can simultaneously retrieve six material parameters, i.e. permittivity and permeability tensors.

The graphical retrieval method is based on collective data points measured at several incidence angles. The retrieval formulas are transformed into four linear equations representing four straight lines. After measuring scattering parameters at several incidence angles and plotting the data according to the transformed retrieval formula, use linear regression technique to calculate the slope and intercept of the four lines. From the slopes and intercepts, along with the phase unwrapping techniques, the six effective material parameters, permittivity and permeability tensors, can be retrieved simultaneously. The correct phase branch can also be determined unambiguously.

Due to the uncertainty of measurement, the measured data points will be distributed around the straight lines. Linear regression technique can reduce the uncertainty of measurements and the phase ambiguity.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. A method for determining bulk values of permittivity and permeability of metamaterials from a single unit-cell layer with a nontransitory computer readable medium, comprising:
constructing a symmetric ABBA unit cell from an asymmetric AB unit cell wherein thickness of said cells is in the direction going from A to B;
providing at least one frequency of electromagnetic power impinging on said metamaterial;
electronically determining permittivity tensors and permeability tensors for each said frequency using graphical method from the slopes and the Y-intercepts of eight straight lines, Y versus X, given by retrieval formulas:

$$\text{TM:} \quad Y_M = \bar{\epsilon}_x \bar{\mu}_y - \frac{\bar{\epsilon}_x}{\bar{\epsilon}_z} X, \quad Y_m = \frac{\bar{\mu}_y}{\bar{\epsilon}_x} - \frac{X}{\bar{\epsilon}_x \bar{\epsilon}_z}, \quad \text{Equation 12}$$

$$\text{TE:} \quad Y_E = \bar{\epsilon}_y \bar{\mu}_x - \frac{\bar{\mu}_x}{\bar{\mu}_z} X, \quad Y_e = \frac{\bar{\epsilon}_y}{\bar{\mu}_x} - \frac{X}{\bar{\mu}_x \bar{\mu}_z},;$$

wherein said TM formulas retrieve said permittivity and said permeability for the transverse magnetic polarization and said TE formulas retrieve said permittivity and said permeability for the transverse electric polarization;
wherein the real part and the imaginary part of said retrieval formula (Eqn. 12) are plotted separately;
wherein the real parts of said retrieval formulas (Eqn. 12) form four straight lines and the imaginary parts of said retrieval formulas (Eqn. 12) form four straight lines;
wherein said straight lines are formed from experimental data having scattering parameters measured at several angles of incidence;
wherein the slops and the Y-intercepts of said straight lines are determined by linear regression technique because experimental data (Y and X) fluctuate about said straight lines:
electronically determining said X using the equation, $$X = \epsilon_b \mu_b \sin^2\theta;$$

wherein $\epsilon_b$ is the background relative permittivity and $\mu_b$ is the background relative permeability and wherein $\theta$ is the angle of incidence;

wherein said X, said $Y_M$, said Ym, said $Y_E$, and said Ye are dimensionless numbers;

electronically determining said Ye using admittance formula, $$Y_e = \frac{\varepsilon_b}{\mu_b} S\cos^2\theta;$$

electronically determining said $Y_m$ using impedance formula, $$Y_m = \frac{\mu_b}{\varepsilon_b} S\cos^2\theta;$$

electronically determining the value of S using the formula, $$S \equiv \frac{(1-S_{21})^2 - S_{11}^2}{(1+S_{21})^2 - S_{11}^2};$$

wherein $S_{11}$ and $S_{21}$ are, respectively, transmission and reflection coefficients measured from standard transmission and reflection experiments;

wherein said $S_{11}$ and said $S_{21}$ are measured at several angles of incidence including the normal angle of incidence and the oblique angles of incidence;

electronically determining the values of said $Y_M$ and said $Y_E$ using phase-branch equation, $$Y_M = Y_E \equiv \left\{ \frac{1}{k_0 d} \left[ 2m\pi \pm \cos^{-1}\left(\frac{1-S_{21}^2 + S_{11}^2}{2S_{11}}\right) \right] \right\}^2;$$

wherein d is the said thickness of said symmetric cell;

wherein $k_0 = \omega/c$;

wherein $\omega$ is the angular frequency and c is the velocity of light in vacuum;

wherein m is an integer representing phase branch;

wherein the measured scattering parameters $S_{11}$ and $S_{22}$, along with the angles of incidence are constructed into said parameters $Y_M, Y_E$, Ym, Ye, and X using above said recipe;

wherein said $Y_M$, said $Y_E$, said $Y_m$, and said $Y_e$, are linear functions of said X, wherein said X is a linear function of $\sin^2\theta$; and wherein said straight lines are formed by plotting Y versus X, which is equivalent to plotting Y versus $\sin^2\theta$.

2. The method according to claim 1, further comprising electronically determining said ± sign in front of the inverse cosine function in said phase-branch equation, wherein said ± sign is determined from phase-angle formula from Equation 17

$$\varphi = \begin{cases} \cos^{-1} & \text{if } \Im(A) < 0 \\ 2\pi - \cos^{-1} A & \text{if } \Im(A) > 0; \end{cases} \qquad \text{Equation 17}$$

wherein $$A \equiv \frac{1 - S_{21}^2 + S_{11}^2}{2S_{11}} = \qquad \text{Equation 16}$$

$$\cos\varphi = \cos(\varphi_r + i\varphi_i) = \cos\varphi_r \cosh\varphi_i - i\sin\varphi_r \sinh\varphi_i;$$

and wherein $\phi_r$ and $\phi_i$ represent real and imaginary of $\phi$.

3. The method according to claim 1, further comprising electronically determining the correct phase branch m in said phase-branch equation using phase unwrapping technique-I from Equation 18, $$\text{TM:} \quad \min\left\{ \left| \frac{Y_M^0(m)}{Y_m^0} - \frac{S_M(m)}{S_m} \right| : m = 0, \pm 1, \pm 2, \ldots \right\}; \qquad \text{Equation 18}$$

$$\text{TE:} \quad \min\left\{ \left| \frac{Y_E^0(m)}{Y_e^0} - \frac{S_E(m)}{S_e} \right| : m = 0, \pm 1, \pm 2, \ldots \right\};$$

wherein $Y_M^0, Y_E^0, Y_m^0$, and $Y_e^0$ are the Y-intercepts of said straight lines;

wherein $S_M, S_E, S_m$, and $S_e$ are the slopes of said straight lines; and wherein said $S_M$, said $S_E$, said $Y_M^0$, and said $Y_E^0$ are functions of m.

4. The method according to claim 3, further comprising electronically determining the correct phase branch m in said phase-branch equation using phase unwrapping technique-II, from Equation 19, $$TM:\min\{|Y_M^0(m)S_m - Y_m^0 S_M(m)|: m=0,\pm 1,\pm 2,\ldots\};$$

$$TE:\min\{|Y_E^0(m)S_e - Y_e^0 S_E(m)|: m=0,\pm 1,\pm 2,\ldots\}; \qquad \text{Equation 19.}$$

5. The method according to claim 4, further comprising electronically determining the correct phase branch m in said phase-branch equation using phase unwrapping technique-III, from Equation 20

$$\text{TM:} \quad \min\left\{ \left| \frac{Y_M^0(m)}{S_M(m)} - \frac{Y_m^0}{S_m} \right| : m = 0, \pm 1, \pm 2, \ldots \right\}; \qquad (20)$$

$$\text{TE:} \quad \min\left\{ \left| \frac{Y_E^0(m)}{S_E(m)} - \frac{Y_e^0}{S_e} \right| : m = 0, \pm 1, \pm 2, \ldots \right\}.$$

6. The method according to claim 5, further comprising simultaneously determining six bulk-parameters of said permittivity tensor and said permeability tensor of said material from at least one layer of symmetric unit cells using said graphical retrieval method and at least one of said phase unwrapping techniques.

7. The method according to claim 1, wherein for TE polarization $S_{11}$ and $S_{21}$ represents the transmission and reflection coefficients of the electric field; and wherein for TM polarization the transmission and reflection coefficients of the electric field are represented by $$\frac{\varepsilon_1 k_{2z}}{\varepsilon_2 k_{1z}} S_{11}$$

and $-S_{21}$.

8. The method according to claim 1, further comprising electronically determining said three permittivity values of the anisotropic permittivity tensor and said three permeability values of the anisotropic permeability tensor using the slopes and the Y-intercepts of said straight lines, $$\bar{\varepsilon}_x = \frac{n_m}{Z}, \bar{\varepsilon}_y = n_e Y, \bar{\varepsilon}_z = -\frac{\bar{s}_x}{S_M} \text{ and}$$

$$\bar{\mu}_x = \frac{n_e}{Y}, \bar{\mu}_y = n_m Z, \bar{\mu}_z = -\frac{\bar{\mu}_x}{S_E};$$

wherein $S_M$ and $S_E$ are the slopes of said straight lines;
wherein $n_m = \pm\sqrt{Y_M^0}$, $n_e = \pm\sqrt{Y_E^0}$, $Z = \pm\sqrt{Y_M^0}$, $Y = \pm\sqrt{Y_e^0}$;
wherein $Y_M^0, Y_E^0, Y_m^0$, and $Y_e^0$ are the intercepts of said straight lines; and
wherein the ± sign is determined by requiring the imaginary part of the refractive index greater than zero, wherein $\Im(n_m) > 0$ and $\Im(n_e) > 0$, wherein the real part of the impedance is greater than zero, wherein $\Re(Z) > 0$, and wherein the real part of the admittance is greater than zero, wherein $\Re(Y) > 0$.

* * * * *